United States Patent
Olip

(10) Patent No.: US 7,515,931 B2
(45) Date of Patent: *Apr. 7, 2009

(54) FREQUENCY SYNTHESIZER AND SYNTHESIS METHOD FOR GENERATING A MULTIBAND LOCAL OSCILLATOR SIGNAL

(75) Inventor: John A. P. Olip, Dulwich Hill (AU)

(73) Assignee: Cisco Technology, Inc., San Jose, CA (US)

( * ) Notice: Subject to any disclaimer, the term of this patent is extended or adjusted under 35 U.S.C. 154(b) by 512 days.

This patent is subject to a terminal disclaimer.

(21) Appl. No.: 11/301,012

(22) Filed: Dec. 12, 2005

(65) Prior Publication Data

US 2006/0094374 A1    May 4, 2006

Related U.S. Application Data

(63) Continuation of application No. 10/383,101, filed on Mar. 5, 2003, now Pat. No. 7,003,274.

(51) Int. Cl.
*H04M 1/00* (2006.01)
(52) U.S. Cl. ............... 455/552.1; 455/103; 331/18; 331/30; 375/306
(58) Field of Classification Search .......... 455/76, 455/118, 255–265, 323, 313, 316, 552.1, 455/180.3, 190.1, 553.1, 103; 331/18, 30, 331/31; 375/146, 147, 307, 376, 306
See application file for complete search history.

(56) References Cited

U.S. PATENT DOCUMENTS

| | | | | |
|---|---|---|---|---|
| 4,409,563 A | 10/1983 | Vandegraaf | | 331/11 |
| 4,914,405 A * | 4/1990 | Wells | | 331/25 |
| 5,187,722 A * | 2/1993 | Petty | | 375/371 |
| 5,259,007 A | 11/1993 | Yamamoto | | 375/120 |
| 5,604,468 A * | 2/1997 | Gillig | | 331/176 |
| 6,005,443 A | 12/1999 | Damgaard et al. | | 331/14 |
| 6,009,126 A | 12/1999 | Van Bezooijen | | 375/319 |
| 6,011,959 A | 1/2000 | Reeser et al. | | 455/76 |
| 6,072,996 A | 6/2000 | Smith | | 455/189.1 |
| 6,124,763 A | 9/2000 | Lemaire | | 331/45 |
| 6,134,452 A | 10/2000 | Hufford et al. | | 455/552 |
| 6,148,184 A | 11/2000 | Manku et al. | | 455/110 |
| 6,181,212 B1 * | 1/2001 | Khoini-Poorfard et al. | | 331/16 |
| 6,188,880 B1 | 2/2001 | Sanielevici | | 455/296 |
| 6,195,539 B1 | 2/2001 | Galal et al. | | 455/302 |
| 6,205,183 B1 | 3/2001 | Dent | | 375/261 |
| 6,208,875 B1 | 3/2001 | Damgaard et al. | | 455/552 |
| 6,215,362 B1 | 4/2001 | Feng et al. | | 331/17 |
| 6,226,509 B1 | 5/2001 | Mole et al. | | 455/302 |
| 6,229,996 B1 | 5/2001 | Uistola | | 455/168.1 |
| 6,243,428 B1 | 6/2001 | Bottomley et al. | | 375/316 |
| 6,265,917 B1 | 7/2001 | Main et al. | | 327/122 |
| 6,278,867 B1 | 8/2001 | Northcutt et al. | | 455/255 |
| 6,288,616 B1 | 9/2001 | Wang | | 331/57 |

(Continued)

*Primary Examiner*—Edward Urban
*Assistant Examiner*—RuiMeng Hu
(74) *Attorney, Agent, or Firm*—Dov Rosenfeld; Inventek

(57) ABSTRACT

A phase locked loop (PLL) frequency synthesizer to produce a local oscillator signal for a transmitter for operation at a plurality of RF frequency bands that are disparate. The transmitter has an intermediate frequency that is a sizable fraction of the bandwidth of one or more of the RF bands. The transmitter includes at least one RF upconverter, each having a local oscillator input coupled to the frequency synthesizer.

23 Claims, 3 Drawing Sheets

U.S. PATENT DOCUMENTS

| | | | |
|---|---|---|---|
| 6,292,474 B1 | 9/2001 | Ali et al. | 370/328 |
| 6,298,226 B1 | 10/2001 | Lloyd et al. | 455/296 |
| 6,321,074 B1 * | 11/2001 | Lemay | 455/260 |
| 6,348,830 B1 | 2/2002 | Rebeiz et al. | 327/355 |
| 6,405,024 B1 | 6/2002 | Goetz et al. | 455/260 |
| 6,442,380 B1 | 8/2002 | Mohindra | 455/234.11 |
| 6,484,038 B1 * | 11/2002 | Gore et al. | 455/552.1 |
| 6,490,440 B1 * | 12/2002 | Mielke et al. | 455/102 |
| 6,900,700 B2 * | 5/2005 | Oosawa et al. | 331/46 |
| 7,005,899 B2 * | 2/2006 | Fallahi et al. | 327/115 |
| 7,327,993 B2 * | 2/2008 | Khlat | 455/265 |
| 7,436,227 B2 * | 10/2008 | Thomsen et al. | 327/147 |
| 2001/0022537 A1 * | 9/2001 | Melava et al. | 331/16 |
| 2003/0043950 A1 * | 3/2003 | Hansen et al. | 375/376 |
| 2003/0052740 A1 * | 3/2003 | Salmi et al. | 331/100 |
| 2003/0137359 A1 * | 7/2003 | Patana | 331/100 |
| 2003/0197564 A1 * | 10/2003 | Humphreys et al. | 331/11 |
| 2004/0017841 A1 * | 1/2004 | Siwiak | 375/146 |

* cited by examiner

FREQUENCY SYNTHESIZER AND SYNTHESIS METHOD FOR GENERATING A MULTIBAND LOCAL OSCILLATOR SIGNAL

RELATED PATENT APPLICATIONS

The present application is a continuation of U.S. patent application Ser. No. 10/383,101 filed on Mar. 5, 2003 now U.S. Pat. No. 7,003,274 titled FREQUENCY SYNTHESIZER AND SYNTHESIS METHOD FOR GENERATING A MULTIBAND LOCAL OSCILLATOR SIGNAL. The contents of U.S. patent application Ser. No. 10/383,101 are incorporated herein by reference.

BACKGROUND

The present invention is related to wireless communication, and in particular, to frequency synthesizer architecture suitable for multi-band radio transmitters (and receivers) that have a fixed intermediate frequency (IF).

Radio transmitters that use a classic superheterodyne architecture can only cover a radio frequency (RF) bandwidth that is a small fraction of the first intermediate frequency (IF), unless tunable RF filters are used after the second upconversion to RF, or there is extremely high isolation from the local oscillator (LO) to RF.

FIG. 1 shows in simplified form a typical superheterodyne transmitter architecture 100 that includes a first upconverter 103 to convert baseband (or bandpass) I and Q signals to the first IF, an IF amplifier 195 and a filter 107 in the IF path, a second upconverter 109 to convert the filtered IF to RF, and a power amplifier (PA) 111 to amplify the RF. The amplified RF is coupled to a transmit antenna. The two upconverters 103 and 109 use signals from a low-side local oscillator 113 and a high-side local oscillator 115, respectively.

One alternative to using tunable RF filter between the RF upconverter 109 and the antenna is to have an extremely high isolation from the local oscillator(s) to RF. Another alternative is to use a zero-IF architecture, also called direct conversion and homodyne. There are however known advantages to using a superheterodyne architecture over a zero-IF architecture.

It is desired therefore to use a superheterodyne architecture. It also is desired to not use a tunable RF filter. An alternative to a tunable RF filter is to use a superheterodyne architecture, but with a variable IF frequency. A variable IF frequency however is not always easy to achieve or desirable.

One application of interest—and one for which variable IF frequency is a problem—is a transceiver for a wireless local area network (WLAN) such as a WLAN that conforms to one of the IEEE 802.11 standards. Two frequency bands of interest are the 2.4 GHz band (the ISM band) used for example for the IEEE 802.11b and 802.11g standards, and the approximately 5 GHz bands (up to 5.825 GHz) for the IEEE 802.11a and European HiperLAN standards. The level of performance needed in a WLAN typically means that the IF path in a superheterodyne transceiver for WLAN applications is typically a high quality discrete filter, e.g., a discrete SAW filter. Variable IF frequency is usually precluded with such filters.

Is it desired to build substantially monolithic integrated circuit that implements a superheterodyne transmitter and receiver that operate in both these disparate WLAN RF bands. Thus there is a need for a frequency synthesizer that generates the local oscillator signal for a superheterodyne radio transmitter and receiver that has fixed IF and that can be used for both the 2.4 Hz and approximately 5 GHz WLAN bands.

It is further desired to use a fixed IF that is a sizable fraction of the tuning range. For example, an IF of 770 MHz is a sizable fraction of the tuning bandwidth of the approximately 5 GHz WLAN bands. It further is desired to have the same IF path for both bands, e.g., the same transmit front-ends that generate the IF signal for both RF bands. It is also desired to have a relatively low tuning range required for any signal controlled oscillator device, e.g., a voltage controlled oscillator (VCO) in the frequency synthesizer. It also is desired to use a single frequency synthesizer to provide both local oscillator signals for both the 2.4 GHz and approximately 5 GHz RF bands.

Thus there is a need for a frequency synthesizer that generates the local oscillator signal for a superheterodyne radio transmitter and receiver that has these desirable properties.

SUMMARY

Described herein is phase locked loop (PLL) frequency synthesizer to produce a local oscillator signal for a superheterodyne transmitter (or for a receiver) for operation at a first and a second RF frequency band that are disparate. By disparate bands is meant RF bands that are significantly separated. An example is when the first RF band is the 2.4 GHz band and the second is one of the approximately 5 GHz bands.

The transmitter has a fixed intermediate frequency that is a sizable fraction of the bandwidth of one or more of the RF bands. The superheterodyne transmitter includes a first and a second RF upconverter, each having a local oscillator input coupled to the frequency synthesizer. The synthesizer includes a signal controlled oscillator, e.g., a voltage controlled oscillator (VCO) to provide a VCO frequency signal and a non-integer frequency multiplier to produce a frequency multiplied signal having a frequency wither at the VCO frequency or at a non-integer multiple of the VCO signal depending on a control input. The synthesizer further includes a programmable divider accepting the frequency multiplied signal and dividing the frequency of the by a settable amount, a phase detector to compare the phase of the output of the programmable divider to that of a reference oscillator and produce a phase difference signal; and a loop filter to filter a function of the phase difference to produce a control input to the VCO. The non-integer multiple is selected such that the frequency synthesizer can supply the local oscillator signal for both the first and second RF bands, such that the tuning range of the VCO is a relatively low fraction of the VCO frequency, and such that spurious mixer products do not fall in the frequency bands of operation.

Also described is a superheterodyne transmitter that uses such a phase locked loop frequency synthesizer. The transmitter is for operation at a first and a second RF frequency band that are disparate and has a fixed intermediate frequency that is a sizable fraction of the bandwidth of one or more of the RF bands.

Also described herein is a method to produce a synthesized frequency local oscillator signal for a superheterodyne transmitter for operation at a first and a second RF frequency band that are disparate. The transmitter has a fixed intermediate frequency that is a sizable fraction of the bandwidth of one or more of the RF bands.

DETAILED DESCRIPTION

Described herein is a frequency synthesizer suitable for use as a local oscillator signal in a superheterodyne radio transmitter (and receiver) that has a fixed IF and that can operate in a plurality of RF frequency bands, including two disparate RF bands. The IF is at a substantial fraction of the bandwidth of at least one of the RF bands. The frequency synthesizer uses a VCO that has a relatively low tuning range.

Figure 1:
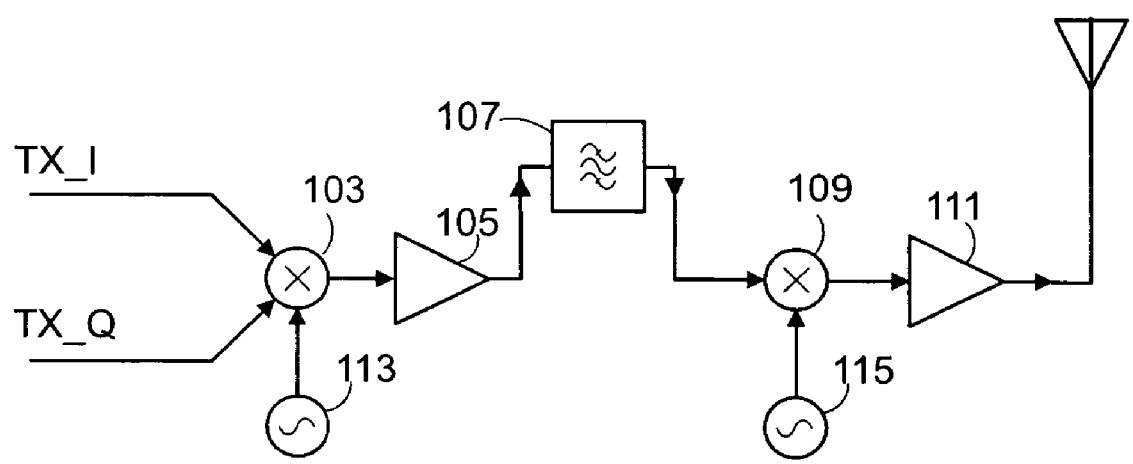
FIG. 1 shows in simplified form a typical superheterodyne transmitter architecture.
Figure 2:
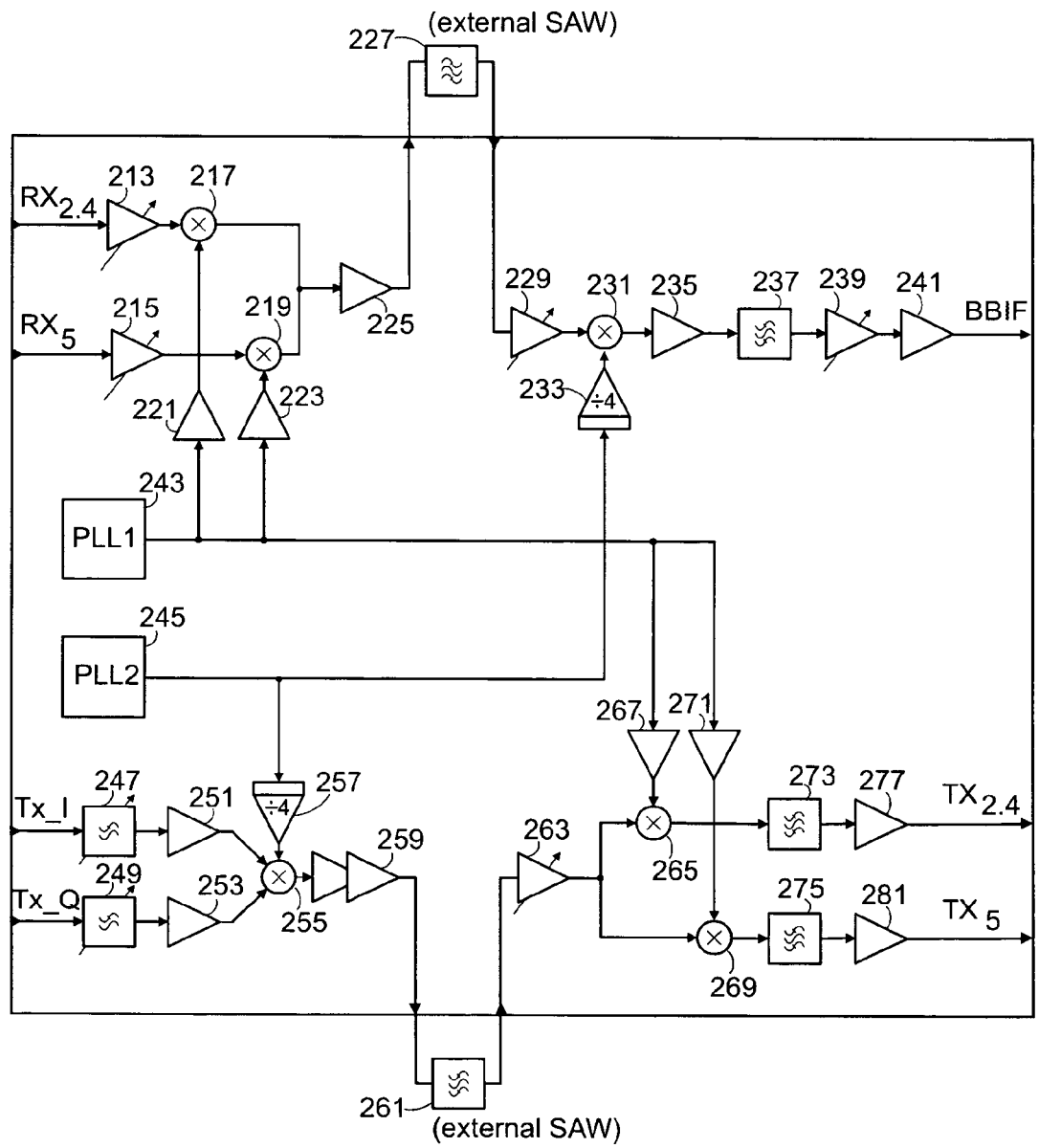
FIG. 2 shows a radio transceiver monolithic integrated circuit 200 that includes a superheterodyne receiver and a superheterodyne transmitter. The radio transceiver includes an embodiment of the present invention providing a local oscillator signal for a pair of upconverters for the superheterodyne transmitter.

FIG. 2 shows a radio transceiver monolithic integrated circuit 200 that includes a substrate and first set of analog subcircuits on the substrate forming a receiver subsystem and a second set of analog subcircuits on the substrate forming a transmitter subsystem.

In order not to unnecessarily obscure the present invention, various well-known structures and interfaces, secondary to the understanding of the invention, are not shown in the chip architecture of FIG. 2.

The transceiver monolithic integrated circuit is for operation in both the 2.4 GHz band and at least one of the approximately 5 GHz bands, e.g., one of the lower and middle FCC UNII bands (between 5.15 and 5.35 GHz) and upper UNII band (between 5.725 and 5.825 GHz) that the IEEE 802.11a operates in and the 5.5 to 5.7 GHz band the HiperLAN standard operates in.

The receiver and transmitter subsystems are each in a two-stage superheterodyne configuration that includes two mixers requiring two oscillator signals. PLL1 (243) and PLL2 (245) are on-chip oscillators—e.g., phase-locked loop (PLL) frequency synthesizers—that generate local oscillator signals for the two mixers that are included in each of the receiver subsystem and transmitter subsystem. In one embodiment, each of PLL1 and PLL2 includes a voltage-controlled oscillator (VCO) and a phase error detector. As described further below, PLL1 provides the RF mixer signals for both the 2.4 GHz and the approximately 5 GHz bands.

The one embodiment, one or more intermediate frequency (IF) filters for the receiver subsystem and for the transmitter subsystem are off-chip. The oscillators 243 and 245 are on-chip. In one embodiment, the analog subcircuits in transceiver 200 are CMOS subcircuits.

One version of the receiver subsystem generates bandpass IF (BBIF) signals of a bandwidth of 20 MHz centered at 20 MHz. An embodiment of the integrated circuit also includes digital subcircuits to provide control, status, and interface logic, not shown in FIG. 2.

In one embodiment, the same fixed intermediate frequency (770 MHz) is used in both the transmitter and the receiver subsystems.

The transmitter subsystem includes a transmitter front end that generates the intermediate frequency signal, and an RF upconverter for each of the disparate frequency bands, i.e., for each of the 2.4 GHz and any of the approximately 5 GHz bands. The transmitter front end accepts quadrature (I and Q) input transmit signals from digital to analog converters in a modem chip (not shown). The modem chip carries out the required modulation and other functions to implement 802.11 physical layer (PHY) processing. In one version, the I and Q input transmit signals are differential signals. These signals are filtered by tunable lowpass filters 247, 249. Amplifiers 251, 253 buffer the lowpass filter outputs and drive the baseband inputs of an intermediate frequency (IF) upconverter 255. The oscillator input of the upconverter 255 is driven by the output—in one embodiment, 750 MHz—from a quadrature oscillator-signal generator 257. The signal generator 257 generates the quadrature oscillator signal by dividing the frequency of synthesizer PLL2 (245) output—in one embodiment, 3.00 GHz—by 4. In one embodiment, the IF upconverter 255 contains a quadrature mixer. The upconverter 255 drives a preamplifier and IF output buffer 259. The output buffer 259 drives an external IF filter 261.

The output of the external IF filter 261 feeds an IF input variable gain amplifier (VGA) 263. In one implementation, the gain of VGA 263 is adjustable using parameters entered via a digital interface (not shown). The VGA 263 provides the output of the transmitter front-end.

The VGA 263 drives the IF input of two RF upconverters 265 and 269 to convert to the 2.4 GHz and approximately 5 GHz bands, respectively. The oscillator inputs of the RF upconverter 265 and 269 are each driven by the output signal—in one embodiment, 3.17-3.27 GHz (IEEE 802.11b), and 4.41-4.55 GHz (IEEE 802.11a) or 6.27-6.47 GHz (HiperLAN)—of synthesizer PLL1 243 after buffering by buffer amplifiers 267 and 271, respectively. In one embodiment, the RF upconverters 265 and 269 each include a double balanced mixer to reject unwanted mixer image products, while in another embodiment, no filter is included.

The upconverters 265 and 269 are followed by RF bandpass filters 273 and 275, respectively, that further suppress unwanted images in the 2.4 and 5 GHz bands, respectively. One aspect of the invention is that these RF filters (called the TX RF filters) need not be tunable.

The output of filters 273 and 275 drive RF power amplifiers 277 and 282, respectively. In one embodiment, the power amplifiers, 277 and 282 each produce complementary output signals in the appropriate frequency band.

One embodiment of the receiver subsystem is now described in more detail. On the RF side, the 2.4 and approximately 5 GHz inputs to the receiver subsystem drive differential-input RF low-noise amplifiers (LNAs) 213 and 215, respectively. In one embodiment, the LNAs 213 and 215 have a settable gain. The LNAs 213 and 215 each feed the RF input of two downconverters, 217 and 219, respectively. The oscillator signal from synthesizer PLL1 243 is buffered by buffer amplifiers 221 and 223, respectively before being fed to the oscillator inputs of the RF downconverters 217 and 219, respectively. In one embodiment, each of the RF downconverter 217 and 219 contains a relatively highly linear double-balanced mixer, a filter and an IF output preamplifier. The outputs of downconverters 217 and 219 are fed to the input an IF output buffer 225. The buffer 225 drives an external IF filter 227 that in one embodiment with quadrature local oscillator signals implements image rejection.

In one embodiment used with a fixed intermediate frequency 770 MHz, for relatively high performance applications, the external IF filter 227 is a surface acoustic wave (SAW) device. In other less-demanding applications, a relatively simple LC filter may be used for IF filter 227.

The output of the external IF filter 227 feeds an IF input VGA 229, whose gain is adjustable using parameters input via the digital interface (not shown). The IF VGA 229 feeds the IF input of a downconverter 231. The quadrature oscillator signal for the down converter 231—in one embodiment, 750 MHz—is generated by a quadrature signal generator 233 by dividing the synthesizer PLL2 (245) output—3.00 GHz in one embodiment—by four. In one embodiment, the IF downconverter 231 contains a quadrature mixer that generates a single in-phase (I) BBIF signal of 20 MHz bandwidth centered on 20 MHz.

The IF downconverter 231 outputs feeds a buffer amplifier 235 that drives a bandpass filter 237 (10-30 MHz in one embodiment). The filter 237 provides further rejection of mixer image products. The output of the filter 237 drives a VGA 239 whose gain is adjustable in using parameters entered via the transceiver digital interface. The VGA output drives a buffer 241. The output of the buffer amplifier is converted to digital samples via an analog-to-digital receiver (not shown) and these samples are then processed by a modem (also not shown) to demodulate and otherwise process the samples for complete 802.11 physical layer (PHY) processing.

In one embodiment in which the IF is 770 MHz, the PLL1 frequency ranges are 3.17-3.27 GHz for the 2.4 GHz mixers and 4.41-4.55 GHz, or 6.27-6.47 GHz for the approximately 5 GHz RF mixers depending on whether the frequency band is IEEE 802.11a or HiperLAN-compatible.

Figure 3:
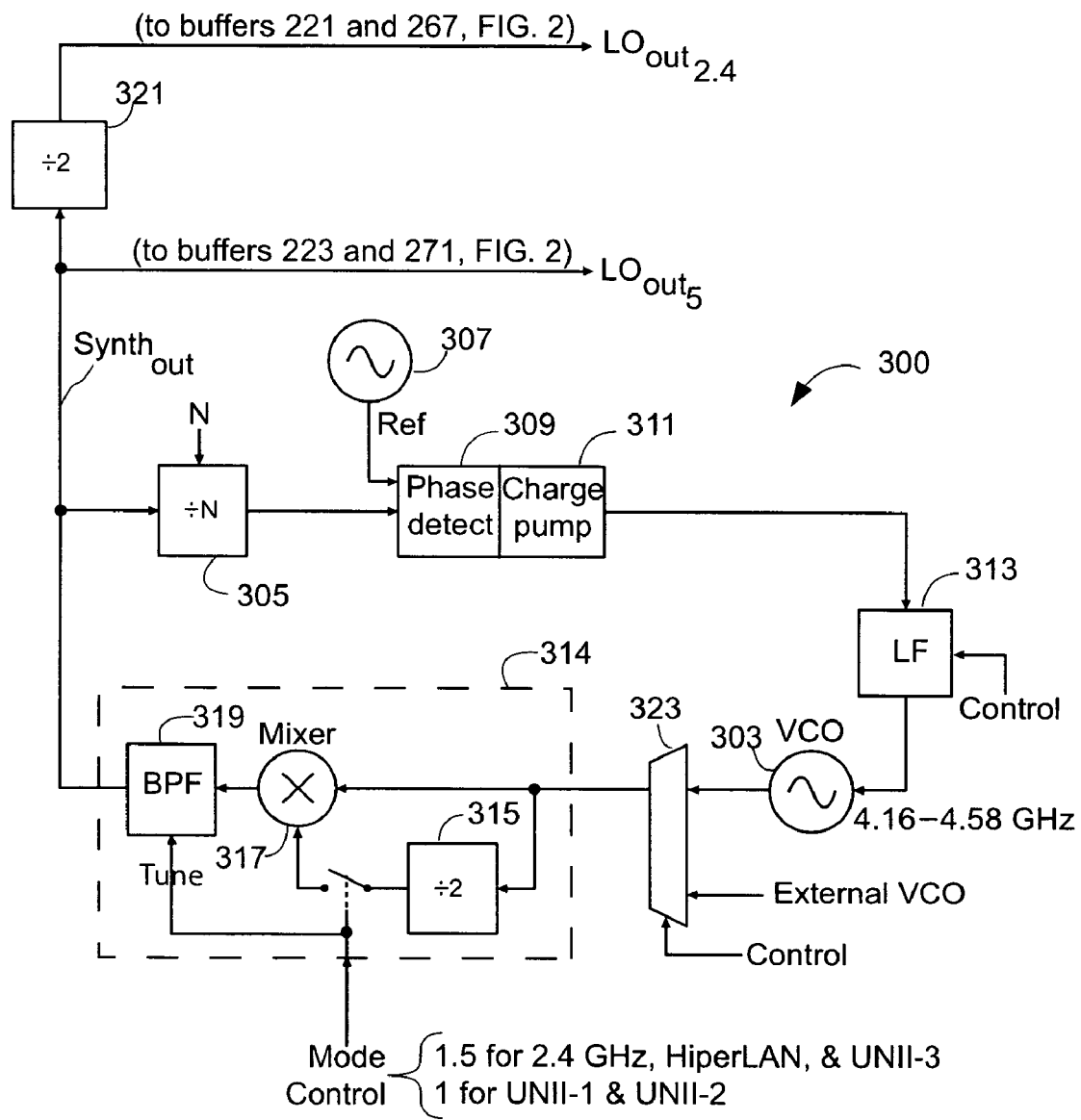
FIG. 3 shows a phase locked loop frequency synthesizer according to one embodiment of the invention.

FIG. 3 shows one embodiment of a phase locked loop frequency synthesizer 300 that provides a local oscillator signal for both the 2.4 GHz and approximately 5 GHz RF mixers in a superheterodyne configuration receiver and/or transmitter with a fixed IF frequency. As one example, frequency synthesizer 300 can be used as PLL1 in FIG. 2.

Frequency synthesizer 300 includes in its feedback loop a voltage controlled oscillator (VCO) 303, a programmable divider 305, a phase detector 309 to compare the phase of the output of the programmable divider to that of a reference oscillator 307, a charge pump 311, and a programmable loop filter 313. The loop filter is programmable by the use of an open drain FET that switches in or out a resistor to modify the loop parameters. Programmability is preferred to compensate for the variation in the loop parameters as a result of the main divider setting "N" and the VCO's VCO constant varying over the range of interest. The programmable divider 305 provides slightly different frequencies, e.g. frequency channels.

In addition, in order to provide outputs that can be used in several output bands, the output of the VCO is to a controllable "times-X" frequency multiplier 314 that processes the VCO output to generate a signal at either the VCO frequency or at X times the VCO frequency depending on a control input. X is a non-integer number >1 so that the input to the programmable divider is either at the VCO frequency or at a non-integer multiple of the VCO frequency under control of a mode control input.

Non-integer X (X>1) is selected to generate cross products that are not in any of the bands of the transceiver. In one embodiment, the times-X frequency multiplier is a times-1.5 frequency multiplier that provides a signal at either the VCO frequency (the "times 1 mode") or at 1.5 times the VCO frequency (the "times 1.5 mode"). The 1.5 times VCO frequency signal is generated by controllably mixing the VCO input with a signal of halve the frequency of the VCO signal generated by a circuit 315 that divides the frequency by 2. The mixing uses a mixer 317 whose first input is the VCO output, and whose second input is may be switched (in the times 1.5 mode) to be the output of the frequency divider 315. The output of mixer 317 is band-pass filtered by filter 319 have a passband that includes the VCO frequency or the sum-frequency product of the mixer output depending on the mode control input such that either the VCO frequency or the sum-frequency product (1.5 times the VCO frequency) is passed. Thus the frequency of the VCO is raised or not by 50% under control of the mode control input.

In one embodiment, the bandpass filter is tuned to be centered around the desired frequency band. The output $Synth_{out}$ of the band pass filter 319 is in the range between the lowest VCO frequency and 1.5 times the highest VCO frequency. Thus, in the times 1 mode, the filter 319 is tuned to be centered around the center of the VCO frequency range (around 4500 MHz), and in the times 1.5 mode, the filter 319 is tuned to be centered around 1.5 times the center of the VCO frequency range, i.e., around 6400 MHz. In one CMOS implementation, the center frequency is tuned between around 4500 MHz and around 6400 MHz by switching in and out a capacitor.

In one embodiment, the synthesizer may also include provision for using an external VCO rather than internal VCO 303 via a MUX 323.

The synthesizer 300 provides two outputs, one via a by-two-frequency divider 321 to the 2.4 GHz buffers to provide the local oscillator signals for the 2.4 GHz RF upconverter 265 and downconverter 217, and the second directly from the input of the programmable divider to the approx. 5 GHz buffers to provide the local oscillator signals for the approx. 5 GHz RF upconverter 269 and downconverter 219.

Referring to FIG. 2, the buffers to the upconverters (in the case of the transmitter) and downconverters (in the case of the receiver) also provide some bandpass filtering, so provide some additional rejection of unwanted signals. In one embodiment, the buffer amplifier 271 for the 5 GHz RF upconverter 269 and the buffer amplifier 223 for the 5 GHz range downconverter 219 are also tuned to provide bandpass filtering around the center the frequency range of PLL1 ($Synth_{out}$) depending on the mode, e.g., according to the mode switch signal of FIG. 3. Still referring to FIG. 2, in some embodiments, the RF mixers themselves, i.e., the RF upconverters and downconverters also provide some image rejection. In other embodiments, the RF upconverters and downconverters provide no inherent image rejection, so that the rejection needs to be provided by the local oscillator signal generators and/or the buffer amplifiers.

Table 1 below summarized how a single frequency synthesizer such as frequency synthesizer 300 is used in PLL1 (243) of the transceiver embodiment 200 shown in FIG. 2 to provide the local oscillator signals to the RF upconverters and RF downconverters for several RF bands.

TABLE 1

| | LO frequencies in MHz IF = 770 MHz, BBIF = 20 MHz | | | |
|---|---|---|---|---|
| | 2.4 GHz band | UNII-1 & UNII-2 | HIPER LAN | UNII-3 |
| RF (MHz) | 2400-2500 | 5180-5320 | 5500-5700 | 5725-5825 |
| $LO_{out}$ (MHz) | 3170-3270 | 4410-4550 | 6270-6470 | 4955-5055 |
| Mixer hi or low | high mixer | low mixer | high mixer | low mixer |
| $Synth_{out}$ (MHz) | 6340-6540 | 4410-4550 | 6270-6470 | 4955-5055 |
| VCO Freq (MHz) | 4227-4360 | 4410-4550 | 4180-4313 | 4955-5055 (Ext) |
| Multiply by 1.5 | ON | OFF | ON | OFF |

Table 1 shows for each frequency band the RF frequency range for the band, and the frequency of the output of PLL1, denoted $LO_{out}$ and shown in MHz. All frequencies are shown rounded to the nearest integer MHz. Table 1 also provides an indication as to whether the high side or low side mixer product is used by the RF upconverter or RF down converter. Table 1 further shows the output frequency of the phase locked loop circuit, denoted $Synth_{out}$, prior to any divide by 2. As shown in FIG. 3, in one embodiment, the frequency synthesizer output $Synth_{out}$ is the input to the programmable divider. Table 1 also shows the range of frequencies of the VCO and whether the multiply-by-1.5 circuit is on or off for that frequency band.

As can be seen, the frequency synthesizer 300 can be used for the 2.4 GHz band, the UNII-1 and UNII-2 (IEEE 802.11a) bands and the HiperLAN band. In one embodiment, the UNII-3 IEEE 802.11a) band uses an external VCO. The internal VCO 303 then has a tuning range of 4.180-4.550 GHz, i.e., 370 MHz—about 8.5% of the middle of the tuning range.

Table 2 below adds to the information in Table 1 for the 2.4 GHz, the UNII-1&UNII-2, and the HIPER LAN bands. The additional information in Table 2 includes the unwanted image (RF upconverter output at each band, as well as the frequency of some spurious products, the RF upconverter outputs that might occur as a result of these spurious products. All frequencies are shown rounded to the nearest MHz.

TABLE 2

LO frequencies and unwanted products in MHz
IF = 770 MHz, BBIF = 20 MHz

|  | 2.4 GHz band | UNII-1,2 bands | HiperLAN |
|---|---|---|---|
| RF (MHz) | 2400 to 2500 | 5180 to 5320 | 5500 to 5700 |
| VCO frequency | 4227 to 4360 | 4410 to 4550 | 4180 to 4313 |
| Times 1.5 or times 1? | ×1.5 | ×1 | ×1.5 |
| Synth$_{out}$ = 1.5 × VCO or 1 × VCO | 6340 to 6540 | 4410 to 4550 | 6270 to 6470 |
| Div2 or not? | yes div2 | no | no |
| LO$_{out}$ | 3170 to 3270 | 4410 to 4550 | 6270 to 6470 |
| Mixer product used for LO$_{out}$ (high or low) | High | Low | High |
| Unwanted mixed image | 3940 to 4040 | 3640 to 3780 | 7040 to 7240 |
| BPF centered at: | 6400 | 4500 | 6400 |
| Some LO spurious products: |  |  |  |
| LO_SPUR_1 | 4227 to 4360 | N/A | 4180 to 4313 |
| LO_SPUR_2 | 6340 to 6540 | N/A | 2090 to 2157 |
| LO_SPUR_3 | 2133 to 2180 | N/A | 8360 to 8626 |
| Possible further products of LO spurious products |  |  |  |
| LO_SPUR_1 + IF | 4997 to 5130 | N/A | 4950 to 5083 |
| LO_SPUR_1 − IF | 3457 to 3590 | N/A | 3410 to 3543 |
| LO_SPUR_2 + IF | 7110 to 7310 | N/A | 2860 to 2927 |
| LO_SPUR_2 − IF | 5570 to 5770 | N/A | 1320 to 1387 |
| LO_SPUR_3 + IF | 2903 to 2950 | N/A | 9130 to 9369 |
| LO_SPUR_3 − IF | 1363 to 1410 | N/A | 7590 to 7856 |

In Table 2, the boldfaced numbers are those potential RF mixer outputs that may cause problems, i.e., are close to the band of operation such that the RF transmit filter—273 or 275 in FIG. 2, depending on the band of operation—may not necessarily attenuate them sufficiently. Consider for example, operating at the HiperLAN band. The spurious local oscillator components resulting from harmonics and subharmonics of the VCO are at multiples half the VCO frequency, i.e., at ranges 2090-2157, 4180-4313, 8360-8627, and so forth (all numbers rounded to integer MHz). The results of these spurious components, if not properly attenuated by the BPF 319 and/or by other components, may cause the following outputs of RF mixer 269 (FIG. 2): 1320 to 1387 MHz, 2860 to 2927 MHz, 3410 to 3543 MHz, 4950 to 5083 MHz, 7590 to 7856 MHz, and 9130 to 9369 MHz. Referring to FIG. 2, RF transmit filters 273 and 275 are assumed to be fixed. Such ranges 9130 to 9369 MHz and 3410 to 3543 MHz are likely to be filtered out by the fixed RF transmit filter 275. The 4950 to 5083 MHz output is close to the UNII-1,2 range, so would be problematic if it were not for the inherent suppression of the 4180-4313 harmonic by the bandpass filter included in the described embodiment of the times 1.5 circuit.

Similarly, when operating in the 2.4 GHz band, there may be images at the RF power amplifier in the 2903 to 2950 range (somewhat close to the 2.4 GHz range) if it were not for the suppression that is provided by the novel inclusion of the times 1.5 circuit that includes filtering out the harmonics that form these unwanted RF output.

Note (from Table 1) that the highest low-side RF mixer product of for the UNI-3 band is 5055 MHz and that falls close to the lowest frequency of the UNII-1 band. In one embodiment, a narrow filter is used in UNII-3 band products.

Thus, the frequency synthesizer 300 provides an extended frequency coverage for a superheterodyne radio with relatively little overhead. The frequency synthesizer 300 can be used in a radio that covers both the 2.4 GHz and approximately 5 GHz IEEE 802.11 bands with a fixed IF: Tunable RF filters are not required. The VCO has a relatively low tuning range. Only a single band external VCO is needed. The LO to RF isolation requirement in the upconverter mixers is relatively modest because none of the spurious products, e.g., from the times-1.5-frequency multiplier fall in band.

Thus a frequency synthesizer has been described that generates a single local oscillator signal. The single local oscillator signal is split to provide local oscillator signals for both the 2.4 GHz and approximately 5 GHz IEEE 802.11 bands for a superheterodyne radio. The base VCO and IF frequencies are selected so that both bands are covered. Non-integer (fractional) multiplication of the base VCO frequency is used. The VCO and IF frequencies and the non-integer multiplication fractional are selected so that because none of the spurious products fall in-band for RF bands covered.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

It should further be appreciated that although the invention has been described in the context of WLANs that conform one or more of the IEEE 802.11 standards and the HiperLAN standard, the invention is not limited to such contexts and may be utilized in various radio applications and systems. Furthermore, the invention is not limited to any one type of architecture or protocols thus, may be utilized in conjunction with one or a combination of architectures/protocols.

Note that some of the claims appended hereto have been written in terms of a frequency synthesizer and a method to provide a local oscillator signal for a transmitter, it will be clear that such a frequency synthesizer is also and alternately to provide a local oscillator signal for a receiver, and the claims are meant to cover such a frequency synthesizer even if only for a receiver.

Furthermore, while the embodiments described herein use a voltage controlled oscillator, different frequency synthesizer embodiments may be constructed using in general a signal controlled oscillator (SCO). The signal may be a current, or a voltage, so some other signal, and how to modify the VCO embodiments to operate with some other signal controlled oscillator, would be clear to those in the art and is intended to be covered by the invention.

Furthermore, while embodiments described herein are radio transceiver integrated circuits, the invention may be applied to other devices that require a PLL frequency synthesizer with reduced overall divide ratio. Furthermore, while embodiments described herein are for CMOS implementation, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

I claim:

1. A transmitter comprising:
   a phase locked loop (PLL) frequency synthesizer having a frequency synthesizer output; and
   at least one RF upconverter, each upconverter having a local oscillator input coupled to the frequency synthesizer output,
   the PLL frequency synthesizer comprising:
   a voltage controlled oscillator (VCO) to provide a VCO frequency signal;
   a switchable non-integer frequency multiplier circuit having a control input, the non-integer frequency multiplier accepting the VCO frequency signal and producing a frequency-multiplied signal at a non-integer multiple of the VCO output frequency or at the VCO output frequency under control of the control input;
   a programmable divider accepting the frequency-multiplied signal and dividing the frequency of the shifted-frequency signal by a settable amount;
   a phase detector to compare the phase of the output of the programmable divider to that of a reference oscillator and produce a phase difference signal; and
   a loop filter to filter a function of the phase difference to produce a control input to the VCO,
   the transmitter being configured for operation at a plurality of RF frequency bands, the RF bands disparate and each having a bandwidth, the transmitter having a intermediate frequency that is a sizable fraction of the bandwidth of one or more of the RF bands,
   wherein the non-integer multiple is selected such that the frequency synthesizer can supply the local oscillator signal for the plurality of RF bands, such that the tuning range of the VCO is a relatively low fraction of the VCO frequency, and such that spurious mixer products do not fall in the frequency bands of operation.

2. A transmitter as recited in claim 1, the frequency synthesizer further comprising a charge pump between the phase detector and the loop filter to provide the input to the loop filter.

3. A transmitter as recited in claim 1, wherein the plurality of RF bands of the transmitter includes the 2.4 GHz band and at least one of the UNII-1, UNII-2, UNII-3, and HiperLAN approximately 5 GHz bands.

4. A transmitter as recited in claim 3, wherein the intermediate frequency of the transmitter is approximately 770 MHz, wherein the non integer multiplier is a 1.5-time-frequency multiplier that multiplies the VCO frequency by 1.5 under control of the switch input, wherein the switch input is on for at least one of the RF bands such that the frequency-multiplied signal is at 1.5 times the VCO frequency, and off for at least one other of the RF bands such that the frequency-multiplied signal is at the VCO frequency.

5. A transmitter as recited in claim 4, wherein the at least one upconverter includes a 2.4 GHz RF upconverter having a local oscillator input coupled to the input of the programmable divider via a second divide-by-2 frequency divider, and a 5 GHz band RF upconverter having a local oscillator input coupled to the input of the programmable divider.

6. A transmitter as recited in claim 4, wherein the 1.5-time-frequency multiplier includes a divide-by-2 accepting the signal from the VCO and producing a signal at half the VCO frequency, a mixer accepting the signal at half the VCO frequency and the signal from the VCO and producing mixer output, and a bandpass filter accepting the mixer output and filtering out mixer products that are not around the VCO frequency or not around 1.5 times the VCO frequency under control of the switch input.

7. A transmitter as recited in claim 1, wherein changing the divide ratio of the programmable divider provides slightly different frequencies that can be used as frequency channels.

8. A transmitter comprising:
   A phase locked loop (PLL) frequency synthesizer having an output; and at least one RF upconverter, each upconverter having a local oscillator input coupled to the frequency synthesizer output,
   the frequency synthesizer comprising:
   a voltage controlled oscillator (VCO) to generate an oscillator output with a frequency controlled by an input signal;
   a programmable frequency divider dividing the frequency of the oscillator output by a predetermined divide ratio to produce a divided frequency signal;
   a reference signal source for producing a referenced frequency signal;
   a phase detector to compare the phase of the referenced frequency signal and of the divided frequency signal to produce a comparison output indicative of the phase difference;
   a loop filter for filtering a signal indicative of the output of the phase detector to generate a filter output with a voltage corresponding to the phase difference and to generate the input signal for the VCO; and
   a switchable non-integer frequency multiplier circuit having a control input, the non-integer frequency multiplier accepting the VCO frequency signal and producing a frequency-multiplied signal at either the VCO output frequency or at a non-integer multiple of the VCO output frequency under control of the control input, the frequency-multiplied signal for input into the programmable frequency divider,
   the transmitter being configured for operation at a plurality of RF frequency bands, the RF bands disparate and each having a bandwidth, the transmitter having a intermediate frequency that is a sizable fraction of the bandwidth of one or more of the RF bands, the transmitter including, wherein the non-integer multiple is selected such that the frequency synthesizer can supply the local oscillator signal for the plurality of RF bands, such that the tuning range of the VCO is a relatively low fraction of the VCO frequency, and such that spurious mixer products do not fall in the RF bands of operation.

9. A transmitter according to claim 8, wherein the frequency multiplier includes a bandpass pass filter to pass signals at either the VCO frequency or the non-integer multiple of the VCO frequency for input into the programmable frequency divider.

10. A transmitter according to claim 9, wherein the non-integer frequency multiplier includes a mixer to mix the VCO output with a signal derived from the VCO output at a fraction of the VCO frequency to produce the input to the band pass filter.

11. A transmitter according to claim 8, further comprising a charge pump between the phase detector and the loop filter to accept the phase detector output and generate the signal indicative of the phase detector output.

12. A transmitter as recited in claim 9, wherein the plurality of RF bands of the transmitter includes the 2.4 GHz band and at least one of the UNII-1, UNII-2, UNII-3, and HiperLAN approximately 5 GHz bands.

13. A transmitter as recited in claim 12, wherein the intermediate frequency of the transmitter is approximately 770 MHz, wherein the non integer multiplier is a 1.5-time-frequency multiplier that multiplies the VCO frequency by 1.5 under control of the control input, wherein the control input is on for at least one of the RF bands such that the frequency-multiplied signal is at 1.5 times the VCO frequency, and off for at least one other of the RF bands such that the frequency-multiplied signal is at the VCO frequency.

14. A transmitter as recited in claim 13, wherein the at least one upconverter includes a 2.4 GHz RF upconverter having a local oscillator input coupled to the input of the programmable divider via a second divide-by-2 frequency divider, and a 5 GHz band RF upconverter having a local oscillator input coupled to the input of the programmable divider.

15. A transmitter as recited in claim 13, wherein the 1.5-time-frequency multiplier includes a divide-by-two circuit accepting the signal from the VCO and producing a signal at half the VCO frequency, a mixer accepting the signal at half the VCO frequency and the signal from the VCO and produces a mixer output as an input to the bandpass filter, such that the bandpass filter filters out signals that are not around the VCO frequency or not around 1.5 times the VCO frequency under control of the control input.

16. A method of producing a synthesized frequency signal as a local oscillator signal for a transmitter for operation at a plurality of RF bands, the method comprising:
    generating a variable frequency signal using a signal controlled oscillator (SCO) whose output frequency is controlled in part by the value of an input signal;
    multiplying the frequency of the oscillator output by a non-integer multiple to generate a multiplied frequency signal having a frequency that is a non-integer multiple of the oscillator frequency;
    dividing the frequency of either the multiplied frequency signal or a signal at the oscillator frequency by a predetermined divide ratio to produce a divided frequency signal;
    providing a referenced frequency signal;
    comparing the phase of the referenced frequency signal and of the divided frequency signal producing a comparison output indicative of a phase difference between the phases; and
    filtering a signal indicative of the phase difference to generate a filter output with a value corresponding to the phase difference to generate the input signal for the SCO,
    wherein the RF bands are disparate and each having a bandwidth, the transmitter having a intermediate frequency that is a sizable fraction of the bandwidth of one or more of the RF bands, the transmitter including at least one RF upconverter, each RF upconverter having a local oscillator input accepting a local oscillator signal produced by the method,
    wherein the non-integer multiple is selected such that the frequency synthesizer can supply the local oscillator signal for the plurality of RF bands, such that the tuning range of the SCO is a relatively low fraction of the SCO frequency, and such that spurious mixer products do not fall in the RF bands of operation, and
    wherein whether the SCO output or the multiplied frequency signal is divided is determined by the RF band of operation.

17. A method as recited in claim 16, wherein the SCO is a voltage controlled oscillator (VCO) and wherein the filtering of the signal indicative of the phase difference produces a voltage signal as the input signal for the VCO.

18. A method as recited in claim 16, wherein the non-integer multiplying includes:
    dividing the frequency of the SCO by an integer to produce a signal at a fraction of the SCO output frequency,
    mixing the divided SCO frequency signal with the output of the SCO to produce a mixed output, and
    band-pass filtering the mixed output to produce the non-integer multiplied frequency signal.

19. A method as recited as recited in claim 16, plurality of RF bands of the transmitter includes the 2.4 GHz band and at least one of the UNII-1, UNII-2, UNII-3, and HiperLAN approximately 5 GHz bands, and
    wherein the intermediate frequency of the transmitter is approximately 770 MHz, wherein the non integer multiplying multiplies the SCO output frequency by 1.5, wherein the dividing is of the multiplied frequency signal for at least one of the RF bands, and of a signal at the SCO output frequency for at least one other of the RF bands.

20. A transmitter comprising:
    a frequency synthesizer having an output; and
    at least one RF upconverter, each RF upconverter having a local oscillator input coupled to the frequency synthesizer output;
    the frequency synthesizer comprising:
    means for generating a variable frequency signal using a signal controlled oscillator (SCO) whose output frequency is controlled in part by the value of an input signal;
    means for multiplying the frequency of the oscillator output by a non-integer multiple to generate a non-integer multiplied frequency signal;
    means for dividing the frequency of either the non-integer multiplied frequency signal or a signal at the SCO frequency by a predetermined divide ratio to produce a divided frequency signal;
    means for comparing the phase of a provided referenced frequency signal and of the divided frequency signal producing a comparison output indicative of a phase difference between the phases; and means for filtering a signal indicative of the phase difference to generate a filter output with a value corresponding to the phase difference to generate the input signal for the SCO, wherein the transmitter is configured for operation at plurality of RF bands, the RF bands disparate and each having a bandwidth, the transmitter having an intermediate frequency that is a sizable fraction of the bandwidth of one or more of the RF band, wherein whether the SCO output or the multiplied frequency signal is divided is determined by the RF band of operation, wherein whether the means for dividing divides the signal at the SCO frequency or the multiplied frequency signal is determined being the RF band of operation, wherein the non-integer multiple is selected such that the frequency synthesizer can supply the local oscillator signal for the plurality of RF bands, such that the tuning range of the SCO is a relatively low fraction of the SCO frequency, and such that spurious mixer products do not fall in the RF bands of operation.

21. A transmitter as recited in claim 20, wherein the SCO is a voltage controlled oscillator (VCO) and wherein the filtering means produces a voltage signal as the input signal for the VCO.

22. A transmitter as recited in claim 20, wherein the means for multiplying includes:

means for dividing the frequency of the output of the SCO to produce a divided SCO-frequency signal, means for mixing the divided SCO-frequency signal with the output of the SCO to produce a mixed output, and means for bandpass filtering the mixed output to produce the non-integer multiplied frequency signal.

23. A transmitter as recited in claim 20, wherein the plurality of RF band includes the 2.4 GHz band and at least one of the UNII-1, UNII-2, UNII-3, and HiperLAN approximately 5 GHz bands, and wherein the intermediate frequency of the transmitter is approximately 770 MHz, wherein the non integer means for multiplying multiplies the SCO output frequency by 1.5, wherein the means for dividing divides the multiplied frequency signal for at least one of the RF bands such that the frequency-multiplied signal is at 1.5 times the SCO frequency, and divides a signal at the SCO output frequency for at least one other of the RF bands.

* * * * *

UNITED STATES PATENT AND TRADEMARK OFFICE
CERTIFICATE OF CORRECTION

PATENT NO.       : 7,515,931 B2                                    Page 1 of 1
APPLICATION NO.  : 11/301012
DATED            : April 7, 2009
INVENTOR(S)      : Olip It is certified that error appears in the above-identified patent and that said Letters Patent is hereby corrected as shown below:

In column 12, line 34, kindly insert --wherein-- between "claim 16," and "plurality"

Signed and Sealed this

Sixth Day of April, 2010

David J. Kappos
*Director of the United States Patent and Trademark Office*